United States Patent
Chung et al.

(10) Patent No.: US 10,185,218 B2
(45) Date of Patent: Jan. 22, 2019

(54) METHOD OF TRANSFERRING REVERSE PATTERN BY USING IMPRINT PROCESS

(71) Applicant: Samsung Electronics Co., Ltd., Suwon-si, Gyeonggi-do (KR)

(72) Inventors: Jaeseung Chung, Suwon-si (KR); Dongouk Kim, Pyeongtaek-si (KR); Joonyong Park, Suwon-si (KR); Jihyun Bae, Seoul (KR); Bongsu Shin, Seoul (KR); Jong G. Ok, Seoul (KR); Ilsun Yoon, Seongnam-si (KR); Sunghoon Lee, Seoul (KR); Sukgyu Hahm, Gyeongju-si (KR)

(73) Assignee: SAMSUNG ELECTRONICS CO., LTD, Gyeonggi-Do (KR)

( * ) Notice: Subject to any disclaimer, the term of this patent is extended or adjusted under 35 U.S.C. 154(b) by 241 days.

(21) Appl. No.: 14/733,172

(22) Filed: Jun. 8, 2015

(65) Prior Publication Data
US 2016/0023400 A1 Jan. 28, 2016

(30) Foreign Application Priority Data
Jul. 25, 2014 (KR) ........................ 10-2014-0095015

(51) Int. Cl.
*G03F 7/00* (2006.01)
(52) U.S. Cl.
CPC .................................. *G03F 7/0002* (2013.01)
(58) Field of Classification Search
CPC combination set(s) only.
See application file for complete search history.

(56) References Cited

U.S. PATENT DOCUMENTS

| | | | |
|---|---|---|---|
| 7,186,656 B2 | 3/2007 | Sreenivasan et al. | |
| 7,396,475 B2 | 7/2008 | Sreenivasan et al. | |
| 7,547,504 B2 | 6/2009 | Sreenivasan et al. | |
| 7,807,087 B2 | 10/2010 | Park et al. | |
| 8,066,930 B2 | 11/2011 | Sreenivasan et al. | |

(Continued)

FOREIGN PATENT DOCUMENTS

| | | |
|---|---|---|
| KR | 100884811 B1 | 2/2009 |
| KR | 1020090087217 A | 8/2009 |

(Continued)

OTHER PUBLICATIONS

A. Tavakkoli K. G., et al., Reverse Nanoimprint Lithography for Fabrication of Nanostructures, 2012, pp. 835-838, vol. 4, Nanoscience and Nanotechnology Letters.

(Continued)

*Primary Examiner* — Austin Murata
(74) *Attorney, Agent, or Firm* — Cantor Colburn LLP

(57) ABSTRACT

A method of transferring a reverse pattern using an imprint process includes: preparing a master mold, where a first pattern is defined on a surface of the master mold; coating an imprint resin on the master mold to cover the first pattern; pressing the imprint resin toward the master mold using a stamp member; curing the imprint resin to form a second pattern between the master mold and the stamp member, where the second pattern has a reverse shape to a shape of the first pattern; detaching the stamp member from the master mold to separate the second pattern from the master mold; and transferring the second pattern onto a transfer substrate.

11 Claims, 3 Drawing Sheets

(56) References Cited

U.S. PATENT DOCUMENTS

| | | |
|---|---|---|
| 2006/0021533 A1 | 2/2006 | Jeans |
| 2007/0218398 A1* | 9/2007 | Ito ............................. C07F 7/12 430/141 |
| 2008/0190888 A1* | 8/2008 | Heejoon ................. B41M 1/34 216/43 |
| 2009/0129986 A1* | 5/2009 | Wimberger-Friedl ...................... B01L 3/502707 422/400 |
| 2010/0230039 A1* | 9/2010 | Hubert ................... B82Y 10/00 156/239 |
| 2012/0205838 A1* | 8/2012 | Washiya ................ B82Y 10/00 264/447 |
| 2014/0093692 A1 | 4/2014 | Miyazawa et al. |
| 2015/0202834 A1* | 7/2015 | Free ...................... B32B 37/025 428/141 |
| 2016/0017074 A1* | 1/2016 | Wada ...................... B29C 59/02 522/173 |

FOREIGN PATENT DOCUMENTS

| | | |
|---|---|---|
| KR | 1020100011776 A | 2/2010 |
| KR | 101325323 B1 | 10/2013 |

OTHER PUBLICATIONS

Ariadna Fernandez et al., Anti-wetting surfaces fabricated by Reverse Nanoimprint Lithography on Silicon and metal-coated substrates, 2 pages, Catalan Institute of Nanoscience and Nanotechnology.

Hak-Jong Choi et al., Fabrication of Superhydrophobic and Oleophobic Surfaces with Overhang Structure by Reverse Nanoimprint Lithography, Article, 2013, pp. 24354-24359, 117, The Journal of Physical Chemistry C, ACS Publications.

Kang-Soo Han et al., Fabrication of 3D nano-structures using reverse imprint lithography, 2013, 8 pages, 24, Nanotechnology.

* cited by examiner

METHOD OF TRANSFERRING REVERSE PATTERN BY USING IMPRINT PROCESS

RELATED APPLICATION

This application claims priority to Korean Patent Application No. 10-2014-0095015, filed on Jul. 25, 2014, and all the benefits accruing therefrom under 35 U.S.C. § 119, the content of which in its entirety is herein incorporated by reference.

BACKGROUND

1. Field

Exemplary embodiments relate to a method of transferring a reverse pattern of a master mold using an imprint process.

2. Description of the Related Art

Nano imprint lithography is a nano/micro patterning technology that may replace photolithography and electron beam lithography. In a conventional nano imprint process, when an imprint resin, which is cured by a light having a specific wavelength, is deposited on a substrate and then pressed by a mold having a shape opposite to a pattern to be formed, a fluidic imprint resin fills an empty space in the mold due to a capillarity phenomenon. The imprint resin is cured by light irradiated thereon and then the mold is removed to form a pattern on the substrate.

In general, in a device fabricating process, a pattern formed by a nano imprint process may be used as a sacrificial layer in a subsequent process. For example, the pattern may be an etching mask.

In a nano imprint transfer method, a first pattern of a master mold is transferred to a stamp mold to form a second pattern on the stamp mold. The second pattern has an opposite shape to the first pattern. Thereafter, the second pattern is transferred by the stamp mold to a transfer substrate to form a third pattern on the transfer substrate. The third pattern may have the same shape as the first pattern.

However, in such a conventional nano imprint process, a pattern that has a top area larger than a bottom area, or a pattern to a transfer substrate having a curved surface may not be effectively transferred.

SUMMARY

Exemplary embodiments relate to a method of directly transferring a pattern having an opposite shape to a pattern of a master mold onto a transfer substrate.

According to an exemplary embodiment, a method of transferring a reverse pattern using an imprint process includes: preparing a master mold, where a first pattern is defined on a surface of the master mold; coating an imprint resin on the master mold to cover the first pattern; pressing the imprint resin toward the master mold using a stamp member; curing the imprint resin to form a second pattern between the master mold and the stamp member, where the second pattern has a reverse shape to a shape of the first pattern; detaching the stamp member from the master mold to separate the second pattern from the master mold; and transferring the second pattern onto a transfer substrate.

In an exemplary embodiment, the second pattern may include a bottom portion disposed on the stamp member and a plurality of convex portions protruding from the bottom portion, and the transferring the second pattern onto the transfer substrate may include removing the bottom portion of the second pattern.

In an exemplary embodiment, each of the convex portions of the second pattern may have a first surface on the transfer substrate and a second surface spaced apart from the transfer substrate, and the second surface may have a larger area than the first surface.

In an exemplary embodiment, the removing the bottom portion of the second pattern may include ashing or dry etching the bottom portion.

In an exemplary embodiment, the transferring the second pattern onto the transfer substrate may include: attaching the stamp member onto the transfer substrate such that the second pattern contacts the transfer substrate; and separating the stamp member from the second pattern.

In an exemplary embodiment, the stamp member may include a pressure-sensitive adhesive ("PSA") film.

In an exemplary embodiment, the separating of the stamp member from the second pattern may include annealing the PSA film.

According to an exemplary embodiment, the attaching the stamp member onto the transfer substrate may include: providing an adhesive layer on the transfer substrate; and attaching the second pattern onto the adhesive layer.

In an exemplary embodiment, the adhesive layer may include a solution including a silane-based coupling agent.

In an exemplary embodiment, the attaching the stamp member onto the transfer substrate may further include irradiating ultraviolet light to the adhesive layer.

In an exemplary embodiment, the providing the adhesive layer on the transfer substrate may include performing an oxygen plasma treatment or an ultraviolet ozone treatment on the transfer substrate.

According to another exemplary embodiment, the attaching the stamp member onto the transfer substrate may include: providing an adhesive layer on the second pattern; and attaching the adhesive layer on the second pattern onto the transfer substrate.

In an exemplary embodiment, the transfer substrate may have a larger area than the second pattern, and the transferring the second pattern onto the transfer substrate may be repeated performed.

In an exemplary embodiment, the preparing of the master mold may include forming a release coating on the master mold.

BRIEF DESCRIPTION OF THE DRAWINGS

These and/or other features will become apparent and more readily appreciated from the following description of exemplary embodiments, taken in conjunction with the accompanying drawings, in which.

DETAILED DESCRIPTION

Figure 1A:
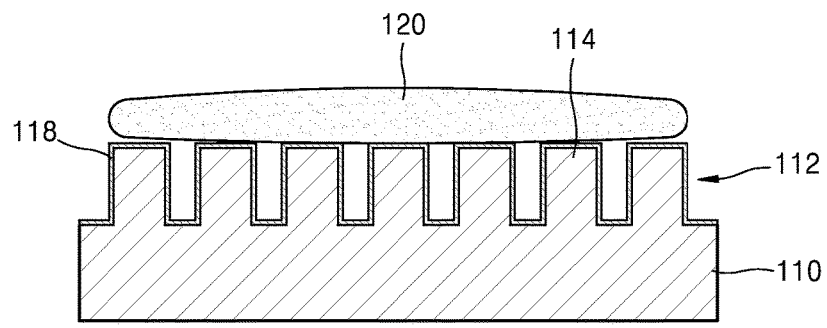
FIGS. 1A to 1F are cross-sectional views schematically illustrating an exemplary embodiment of a method of transferring a reverse pattern according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1B:
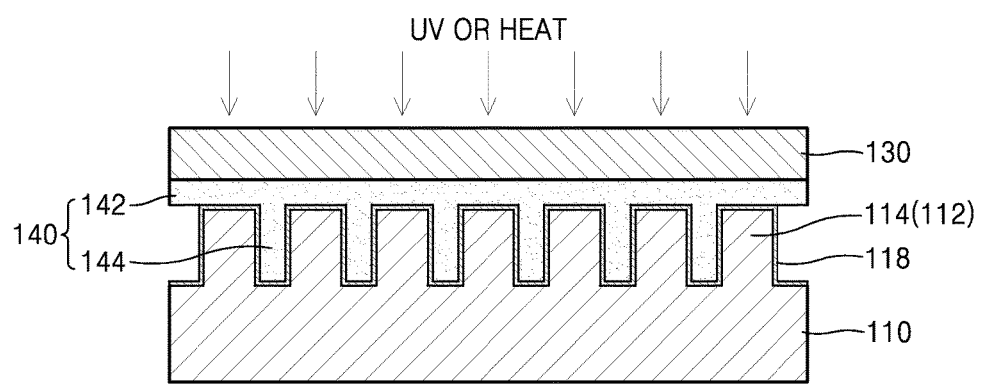
Figure 1C:
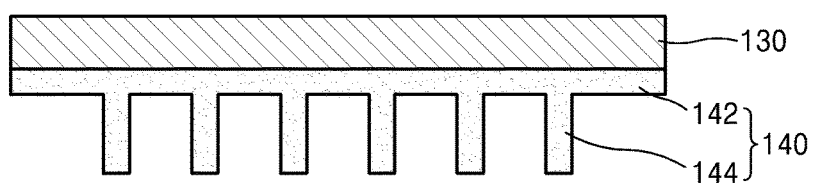
Figure 1D:
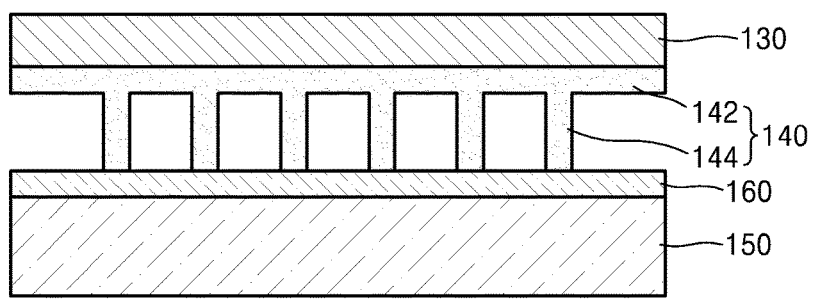
Figure 1E:
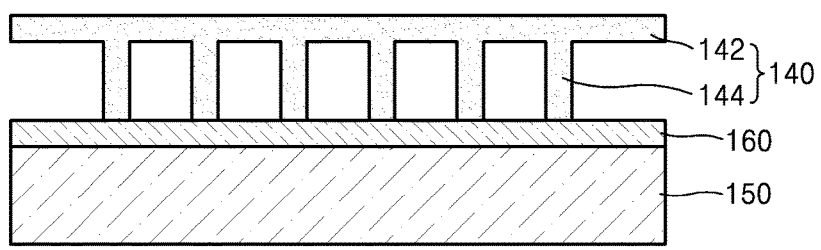
Figure 1F:
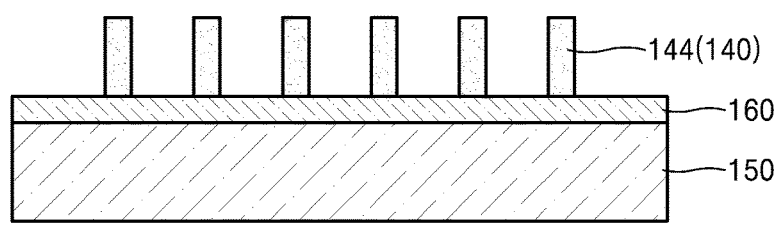
Figure 2:
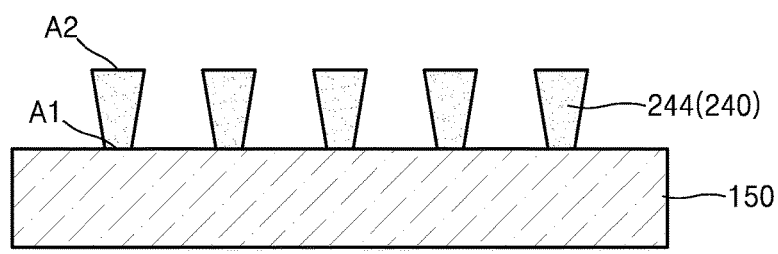
FIG. 2 is a cross-sectional view illustrating an exemplary embodiment of the reverse pattern on a transfer substrate.

Hereinafter, exemplary embodiments of the invention will be described in detail with reference to the accompanying drawings FIGS. 1A to 1F are cross-sectional views schematically illustrating an exemplary embodiment of a method of transferring a reverse pattern according to the invention, and FIG. 2 is a cross-sectional view schematically illustrating an exemplary embodiment of the reverse pattern on a transfer substrate.

Referring to FIG. 1A, in an exemplary embodiment, a master mold 110 having a first pattern 112 defined on a side or surface (e.g., an upper side or surface) thereof is prepared. In one exemplary embodiment, for example, the master mold 110 may include a silicon wafer, but the invention is not limited thereto. In one alternative exemplary embodiment, for example, the master mold 110 may include or be formed of quartz or the like. The first pattern 112 may include a plurality of convex portions 114. The width of each of the convex portions 114 and the distance between the convex portions 114 may be in the range of nanometers or micrometers.

In such an embodiment, a release coating 118 may be provided or formed on the master mold 110. The release coating 118 may include a material including fluorine. In one exemplary embodiment, the release coating may be, for example, a Teflon® coating. In an alternative exemplary embodiment, the release coating 118 may be omitted.

In an exemplary embodiment, an imprint resin 120 is provided, e.g., coated, on the master mold 110 to cover the first pattern 112. The imprint resin 120 may be an ultraviolet ("UV")-curable resin or a thermosetting resin.

The UV-curable resin may include an acryl-based resin, a polyimide-based resin, a polyamide-based resin, a novolac-based resin, a poly methyl methacrylate ("PMMA") resin, a buthyl methacrylate ("BMA") resin, a urethane acrylate resin, a poly vinyl alcohol resin, or the like.

The thermosetting resin may be an epoxy resin, an amino resin, a phenol resin, a polyester resin, or the like.

Referring to FIG. 1B, in an exemplary embodiment, a stamp member 130 is disposed on the master mold 110 to cover the imprint resin 120. The stamp member 130 may be a pressure-sensitive adhesive ("PSA") film that has a temporary adhesive force. The PSA film may have a thickness of about 50 micrometers (μm) or more. In one exemplary embodiment, for example, the PSA film may have a thickness in a range of about 50 μm to about 300 μm.

In an alternative exemplary embodiment, the stamp member 130 may include any material that has an adhesive force and loses the adhesive force when heat or light is irradiated thereto. In one exemplary embodiment, for example, the stamp member 130 may include a foam adhesive film.

Thereafter, heat is applied or UV light is irradiated to the imprint resin 120 to cure the imprint resin 120. When the imprint resin 120 is cured, a second pattern 140 corresponding to the first pattern 112 is formed between the stamp member 130 and the master mold 110.

In an exemplary embodiment, the second pattern 140 may include a bottom portion 142 including a residual resin, and a plurality of convex portions 144 protruding from the bottom portion 142.

In an alternative exemplary embodiment, the second pattern 140 may include a plurality of convex portions 144 without the bottom portion 142 that is a residual layer.

Referring to FIG. 1C, in an exemplary embodiment, the stamp member 130 is separated from the master mold 110. In an exemplary embodiment, the second pattern 140 may be attached to the stamp member 130 by the adhesive force of the stamp member 130 to be separated from the master mold 110. In an exemplary embodiment, where the release coating 118 is provided on the master mold 110, the second pattern 140 may be effectively and efficiently detached from the master mold 110.

Referring to FIG. 1D, in an exemplary embodiment, the stamp member 130, to which the second pattern 140 is attached, is disposed on a transfer substrate 150 to allow the second pattern 140 to face the transfer substrate 150. The second pattern 140 is attached to a side or a surface of the transfer substrate 150. The transfer substrate 150 may be a glass substrate, and an etching target, for example, an aluminum layer, may be provided or formed on the transfer substrate 150. When the etching target is formed on the transfer substrate 150, the second pattern 140 is attached onto the etching target.

An adhesive layer 160 may be provided on the transfer substrate 150 prior to disposing the stamp member 130 and the second pattern 140, which are attached to each other, on the transfer substrate 150, such that the second pattern 140 may be effectively or efficiently attached onto the transfer substrate 150. In one exemplary embodiment, for example, an adhesion promoter layer may be coated as the adhesive layer 160 on the transfer substrate 150. The adhesion promoter layer may include an UV-curable material. In one exemplary embodiment, for example, the adhesion promoter layer may include a solution including a silane-based coupling agent. In such an embodiment, the solution may include ethanol or the like as a solvent thereof.

In such an embodiment, the silane-based coupling agent may include gamma-glycidoxy propyl trimethoxysilane, mercapto propyl trimethoxysilane, methyl trimethoxysilane, trialkoxysilane or a combination thereof, for example. The adhesion promoter layer may be formed by spin coating, drop dispensing, or deposition, for example.

In an exemplary embodiment, where the etching target is on the transfer substrate 150, the adhesive layer 160 may be provided or formed on the etching target.

In an exemplary embodiment, UV light may be irradiated to the adhesion promoter layer, such that the second pattern 140 may be effectively or efficiently attached to the adhesion promoter layer.

In an alternative exemplary embodiment, instead of coating the adhesion promoter layer, and an oxygen plasma treatment or an ultraviolet ozone treatment is performed on the surface of the transfer substrate 150 to increase the adhesive force between the transfer substrate 150 and the second pattern 140.

In an exemplary embodiment, where the oxygen plasma treatment is performed on the surface of the transfer substrate 150, a chamber pressure is maintained at about 0.4 millibar (mbar), an about 100 Watts (W) power is used, and oxygen gas is supplied at about 5 standard cubic centimeters per minute (sccm) into a chamber. The oxygen plasma treatment is performed for about 60 seconds.

In an exemplary embodiment, where the ultraviolet ozone treatment is performed on the surface of the transfer substrate 150, an ultraviolet lamp is used to irradiate an ultraviolet light with a wavelength of about 254 nanometers (nm) at an intensity of about 28,000 microWatts per square centimeter ($\mu W/cm^2$) for about 90 seconds. In such an embodiment, when the ultraviolet light reacts with oxygen in the chamber, ozone and also oxygen atoms providing strong oxidation are generated. The oxygen atoms clean the surface of the transfer substrate 150 to increase the adhesive force thereof.

Hereinafter, for convenience sake, a region modified by the oxygen plasma treatment or the ultraviolet ozone treatment may also be referred to as the adhesive layer 160.

In an alternative exemplary embodiment, instead of on the transfer substrate 150, the adhesive layer 160 may be provided or formed on a top surface of the second pattern 140. In one exemplary embodiment, for example, the second pattern 140 may be dipped into a solution including an adhesive material.

In an exemplary embodiment, an adhesive material may be formed on the second pattern 140 by vapor deposition. In such an embodiment, the adhesive material may be a silane-based solution.

Referring to FIG. 1E, in an exemplary embodiment, the stamp member 130 is detached from the second pattern 140. In an exemplary embodiment, where the stamp member 130 includes a PSA film, the PSA film may be effectively or efficiently detached from the second pattern 140 by applying heat of about 110° C. thereto for about several seconds.

Referring to FIG. 1F, in an exemplary embodiment, the bottom portion 142, which is the residual imprint resin connecting the convex portions 144, is removed. In such an embodiment, the bottom portion 142 may be removed by dry etching or ashing.

As a result, the second pattern 140 remains on the transfer substrate 150. In such an embodiment, the second pattern 140 may function as a hard mask that is used to etch the transfer substrate 150. Accordingly, the transfer substrate 150 may be etched using the second pattern 140 as the hard mask.

In an exemplary embodiment, as described above, the area of the top surface of the convex portion 144 of the second pattern 140 is equal to the area of the bottom surface of the convex portion 144. However, the present embodiment is not limited thereto. In an alternative exemplary embodiment, as illustrated in FIG. 2, a second pattern 240 may include a plurality of convex portions 244 on the transfer substrate 150, and an area A2 of the top surface of the second pattern 240 may be larger than an area A1 of the bottom surface of the second pattern 240 that contacts the transfer substrate 150. In such an embodiment, the convex portions may be in a cone-like shape. In such an embodiment, an adhesive layer 160 (see FIG. 1F) may be further provided or formed between the transfer substrate 150 and the second pattern 240.

According to the exemplary embodiments, since a reverse pattern that has an opposite shape to the pattern of the master mold is directly transferred onto the transfer substrate, the number of the imprint process may be reduced in comparison with a conventional imprint pattern transfer, and a truncated cone-shaped structure having a bottom-surface area smaller than a top-surface area may be effectively transferred.

In such embodiments, the residual resin exists on a top surface of the pattern to face the transfer substrate, such that the residual resin may be easily removed by a simple ashing process.

In such embodiments, the pattern of the master mold is directly transferred, such that pattern transfer may be effectively and efficiently performed even when the surface of the transfer substrate is curved.

In such embodiments, in the case of using a large-area transfer substrate, transferring of the second pattern may be repeatedly performed on the large-area transfer substrate.

It should be understood that the exemplary embodiments described herein should be considered in a descriptive sense only and not for purposes of limitation. Descriptions of features or aspects within each exemplary embodiment should typically be considered as available for other similar features in other exemplary embodiments.

What is claimed is:

1. A method of transferring a reverse pattern using an imprint process, the method comprising:
   preparing a master mold, wherein a first pattern is defined on a surface of the master mold;
   coating an imprint resin on the master mold to cover the first pattern;
   disposing a stamp member on the master mold to cover the imprint resin such that the imprint resin is pressed toward the master mold by the stamp member, wherein the stamp member is a pressure-sensitive adhesive film;
   curing the imprint resin between the master mold and the stamp member to form a second pattern between the master mold and the stamp member, wherein the second pattern has a reverse shape to a shape of the first pattern;
   detaching the stamp member from the master mold to separate the second pattern from the master mold; and
   transferring the second pattern onto a transfer substrate,
   wherein the transferring the second pattern onto the transfer substrate comprises:
      attaching the stamp member onto the transfer substrate such that the second pattern contacts the transfer substrate; and
      separating the stamp member from the second pattern,
      wherein the separating the stamp member from the second pattern comprises annealing the pressure-sensitive adhesive film.

2. The method of claim 1, wherein
   the second pattern comprises a bottom portion disposed on the stamp member and a plurality of convex portions protruding from the bottom portion, and
   the transferring the second pattern onto the transfer substrate comprises removing the bottom portion of the second pattern.

3. The method of claim 2, wherein
   each of the convex portions of the second pattern has a first surface on the transfer substrate and a second surface spaced apart from the transfer substrate, and
   an area of the second surface is larger than an area of the first surface.

4. The method of claim 2, wherein the removing the bottom portion comprises ashing or dry etching the bottom portion.

5. The method of claim 1, wherein the attaching the stamp member onto the transfer substrate comprises:
   providing an adhesive layer on the transfer substrate; and
   attaching the second pattern onto the adhesive layer on the transfer substrate.

6. The method of claim 5, wherein the adhesive layer comprises a solution comprising a silane-based coupling agent.

7. The method of claim 6, wherein the attaching the stamp member onto the transfer substrate further comprises irradiating ultraviolet light to the adhesive layer.

8. The method of claim 5, wherein the providing the adhesive layer comprises performing an oxygen plasma treatment or an ultraviolet ozone treatment on the transfer substrate.

9. The method of claim 1, wherein the attaching the stamp member onto the transfer substrate comprises:
   providing an adhesive layer on the second pattern; and
   attaching the adhesive layer on the second pattern onto the transfer substrate.

10. The method of claim 1, wherein
    the transfer substrate has a larger area than the second pattern, and
    the method further comprises:
       coating another imprint resin on the master mold to cover the first pattern;
       pressing the another imprint resin toward the master mold using the stamp member;
       curing the another imprint resin between the master mold and the stamp member to form another second pattern between the master mold and the stamp member;
       detaching the stamp member from the master mold to separate the another second pattern from the master mold; and
       transferring the another second pattern onto the transfer substrate.

11. The method of claim 1, wherein the preparing the master mold comprises providing a release coating on the master mold.

* * * * *